US011348997B2

(12) United States Patent
Kumar et al.

(10) Patent No.: US 11,348,997 B2
(45) Date of Patent: May 31, 2022

(54) SEMICONDUCTOR DEVICES AND METHODS FOR FABRICATING THE SAME

(71) Applicant: Vanguard International Semiconductor Corporation, Hsinchu (TW)

(72) Inventors: Ankit Kumar, Jharkhand (IN); Chia-Hao Lee, New Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 247 days.

(21) Appl. No.: 16/222,163

(22) Filed: Dec. 17, 2018

(65) Prior Publication Data
US 2020/0194543 A1    Jun. 18, 2020

(51) Int. Cl.
*H01L 29/06* (2006.01)
*H01L 29/739* (2006.01)
(Continued)

(52) U.S. Cl.
CPC ...... *H01L 29/063* (2013.01); *H01L 21/26513* (2013.01); *H01L 29/0649* (2013.01);
(Continued)

(58) Field of Classification Search
CPC ............. H01L 29/7393; H01L 29/7394; H01L 29/66325; H01L 29/0646; H01L 29/063;
(Continued)

(56) References Cited

U.S. PATENT DOCUMENTS 6,207,994 B1 * 3/2001 Rumennik ............ H01L 21/26
257/342
6,478,570 B1  11/2002 Suga et al.
(Continued)

FOREIGN PATENT DOCUMENTS

| TW | 200527701 A  | 8/2005 |
| TW | 201230207 A1 | 7/2012 |
| TW | 201631765 A  | 9/2016 |

OTHER PUBLICATIONS

Miyoshi et al., "An Advanced p-Channel LDMOS FET with HTRB Tolerability of High-Voltage Pulse Transmitter ICs for Ultrasound Applications". IEEE, International Symposium on Power Semiconductor Devices & IC's, 2015, p. 393.
(Continued)

*Primary Examiner* — Michael M Trinh
(74) *Attorney, Agent, or Firm* — Birch, Stewart, Kolasch & Birch, LLP (57) ABSTRACT

A semiconductor device includes a substrate, an epitaxial layer, an emitter region, and a collector region. The epitaxial layer is disposed over the substrate and has a first conductivity type. The drift region is disposed in the epitaxial layer and has a second conductivity type that is the opposite of the first conductivity type. The emitter region is disposed in the epitaxial layer outside the drift region. The collector region is disposed in the drift region. The semiconductor device also includes a doped region. The doped region is disposed adjacent to the bottom surface of the drift region and has the first conductivity type.

17 Claims, 10 Drawing Sheets

(51) Int. Cl.
  *H01L 29/66* (2006.01)
  *H01L 21/265* (2006.01)
  *H01L 29/10* (2006.01)
  *H01L 29/40* (2006.01)
(52) U.S. Cl.
  CPC ........ *H01L 29/1095* (2013.01); *H01L 29/402* (2013.01); *H01L 29/66325* (2013.01); *H01L 29/7393* (2013.01); *H01L 29/7394* (2013.01)
(58) Field of Classification Search
  CPC ............. H01L 29/0634; H01L 29/1095; H01L 29/1079; H01L 29/1083; H01L 29/1087; H01L 29/402
  See application file for complete search history.

(56) References Cited

U.S. PATENT DOCUMENTS

| | | | |
|---|---|---|---|
| 6,770,951 B2 | 8/2004 | Huang et al. | |
| 6,958,515 B2 | 10/2005 | Hower et al. | |
| 8,723,256 B1* | 5/2014 | Lin | H01L 29/0634 257/335 |
| 8,907,419 B2* | 12/2014 | Khan | H01L 29/7835 257/335 |
| 2004/0084744 A1* | 5/2004 | Khemka | H01L 29/7816 257/492 |
| 2006/0273402 A1* | 12/2006 | Khemka | H01L 29/0634 257/370 |
| 2014/0231964 A1* | 8/2014 | Lin | H01L 21/0257 257/607 |
| 2015/0243780 A1* | 8/2015 | Lin | H01L 21/26513 257/339 |
| 2016/0064494 A1* | 3/2016 | Chan | H01L 29/0623 257/339 |
| 2018/0130907 A1* | 5/2018 | Hung | H01L 29/1083 |

OTHER PUBLICATIONS

Taiwanese Office Action and Search Report for Taiwanese Application No. 108102660, dated Apr. 12, 2021.

* cited by examiner

SEMICONDUCTOR DEVICES AND METHODS FOR FABRICATING THE SAME

BACKGROUND

Technical Field

The disclosure relates to semiconductor devices, and more particularly, to semiconductor devices having high breakdown voltage and methods for fabricating the same.

Description of the Related Art

Recently, as fabrication techniques for semiconductor integrated circuits (ICs) have developed, the demands are increasing on elements such as controllers, memory, low-voltage operation circuits, and high-voltage operation circuits formed over a single chip to form a single-chip system with increased integration.

In a single-chip system, a high-voltage device such as an insulated gate bipolar transistor (IGBT) is usually used to improve the power conversion efficiency and reduce electricity loss. IGBTs have advantages. Examples of these advantages include high current gain, high operating voltage, and low on-state resistance. IGBTs are useful in high-voltage operation applications.

However, an IGBT is needed to comply with the ongoing trend of reducing the size of single-chip systems while maintaining predetermined or increased current densities, on-state resistance, and off-state breakdown voltage.

SUMMARY

Some embodiments of the present disclosure provide a semiconductor device. The semiconductor device includes a substrate, an epitaxial layer, an emitter region, and a collector region. The epitaxial layer is disposed over the substrate and has a first conductivity type. The drift region is disposed in the epitaxial layer and has a second conductivity type that is the opposite of the first conductivity type. The emitter region is disposed in the epitaxial layer outside the drift region. The collector region is disposed in the drift region. The semiconductor device also includes a doped region. The doped region is disposed adjacent to the bottom surface of the drift region and has the first conductivity type.

Some embodiments of the present disclosure provide a semiconductor device. The semiconductor device includes a substrate, an epitaxial layer, a first region, and a second region. The epitaxial layer is disposed over the substrate and has a first conductivity type. The drift region is disposed in the epitaxial layer and has a second conductivity type that is the opposite of the first conductivity type. The first region is disposed in the epitaxial layer outside the drift region and has the second conductivity type. The second region is disposed in the drift region and has the first conductivity type. The semiconductor device also includes a plurality of third doped regions. The plurality of third doped regions is disposed adjacent to a junction between the drift region and the epitaxial layer and has the first conductivity type.

Some embodiments of the present disclosure provide a method for fabricating a semiconductor device. The method includes providing a substrate, forming an epitaxial layer over the substrate, forming a doped region in the epitaxial layer, and forming a drift region in the epitaxial layer. The epitaxial layer has a first conductivity type. The doped region has the first conductivity type. The drift region has a second conductivity type that is the opposite of the first conductivity type. The doped region is located adjacent to the bottom surface of the drift region. The method also includes forming an emitter region in the epitaxial layer outside the drift region, and forming a collector region in the drift region.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the semiconductor structure in the present disclosure. Some of the features described below can be replaced or eliminated for different embodiments.

The embodiments of the present disclosure provide a semiconductor device. The semiconductor device includes a doped region formed adjacent to the PN junction between the epitaxial layer and the drift region. The doped region has the same conductivity type as the epitaxial layer but the opposite conductivity type of the drift region. The doped region is helpful in redistributing the profile of the electric field from the emitter region to the collector region. Therefore, the off-state breakdown voltage and the reliability of the semiconductor device can be enhanced.

Figure 6:
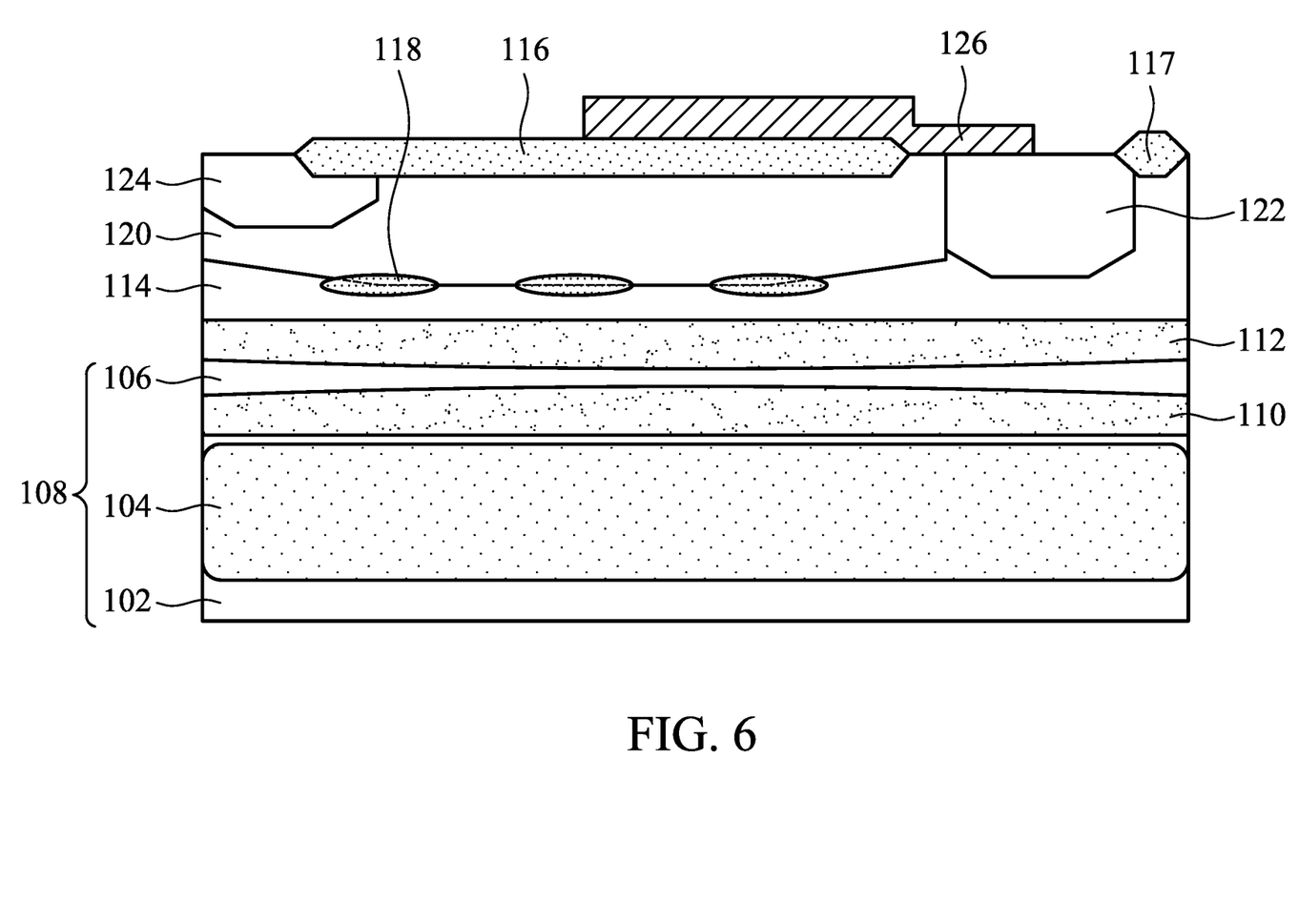
Figure 7:
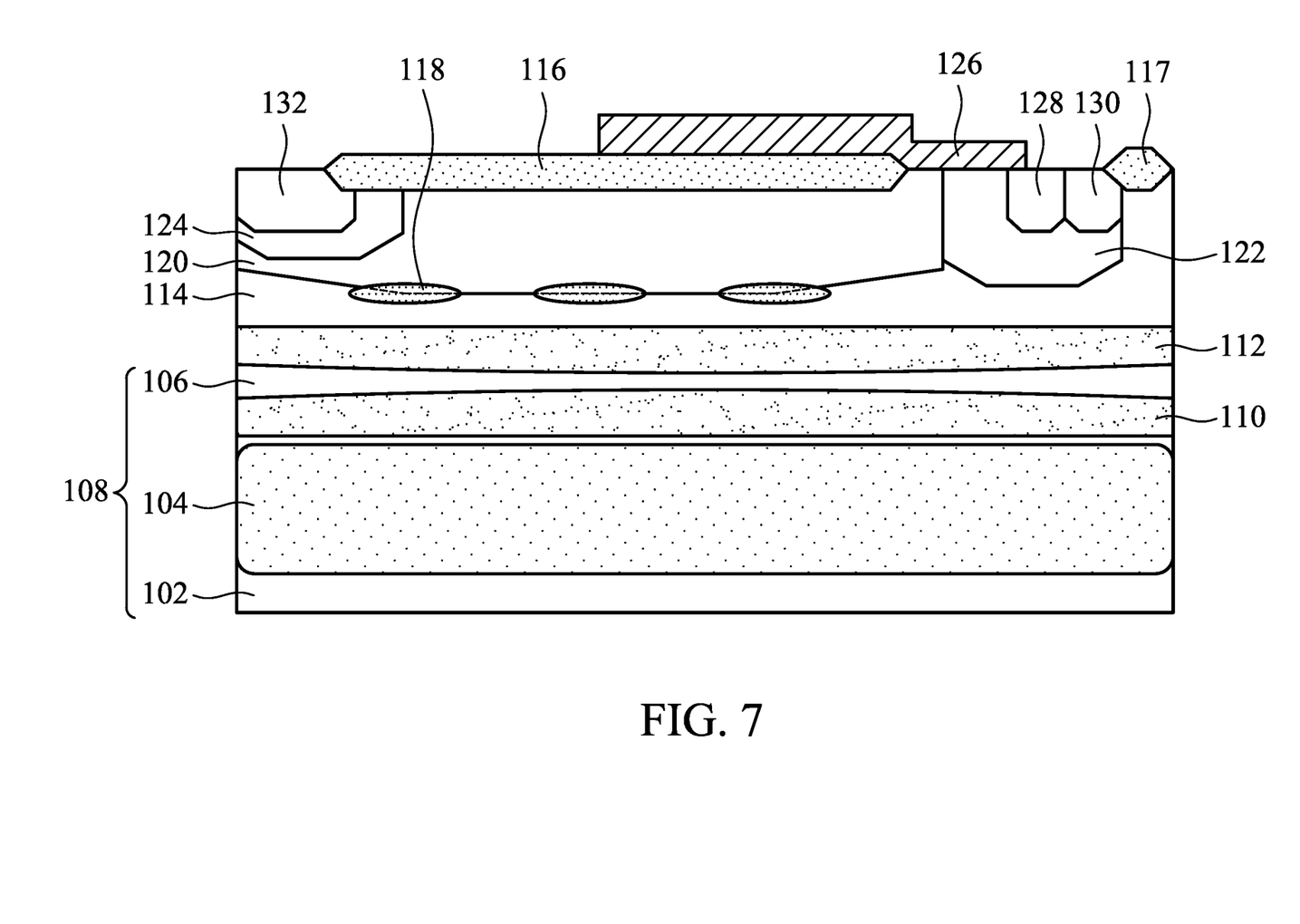
Figure 8:
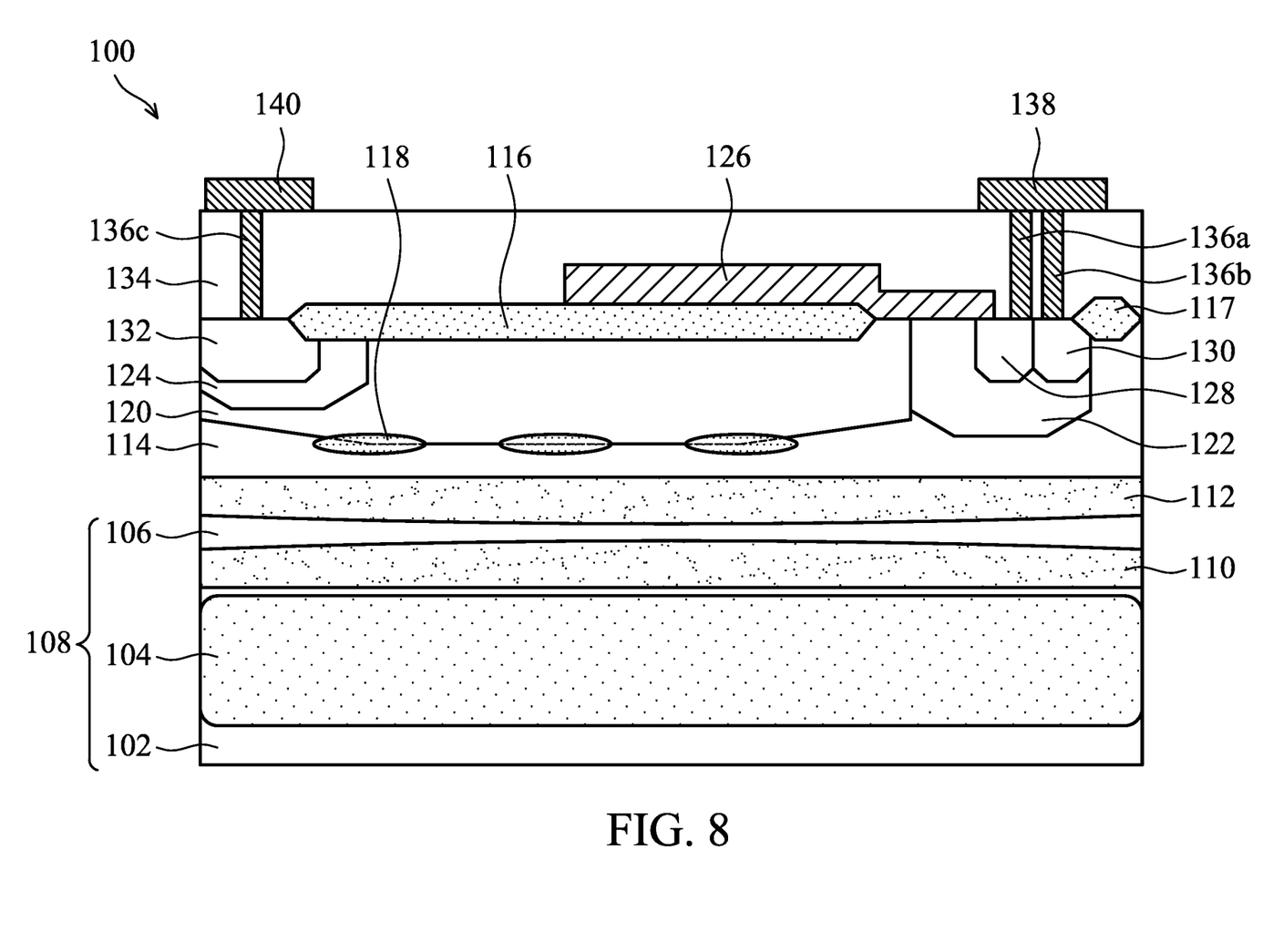

FIGS. 1-8 illustrate cross-sectional views of forming a semiconductor device 100 shown in FIG. 8 at intermediate stages in accordance with some embodiments of the present disclosure.

Figure 1:
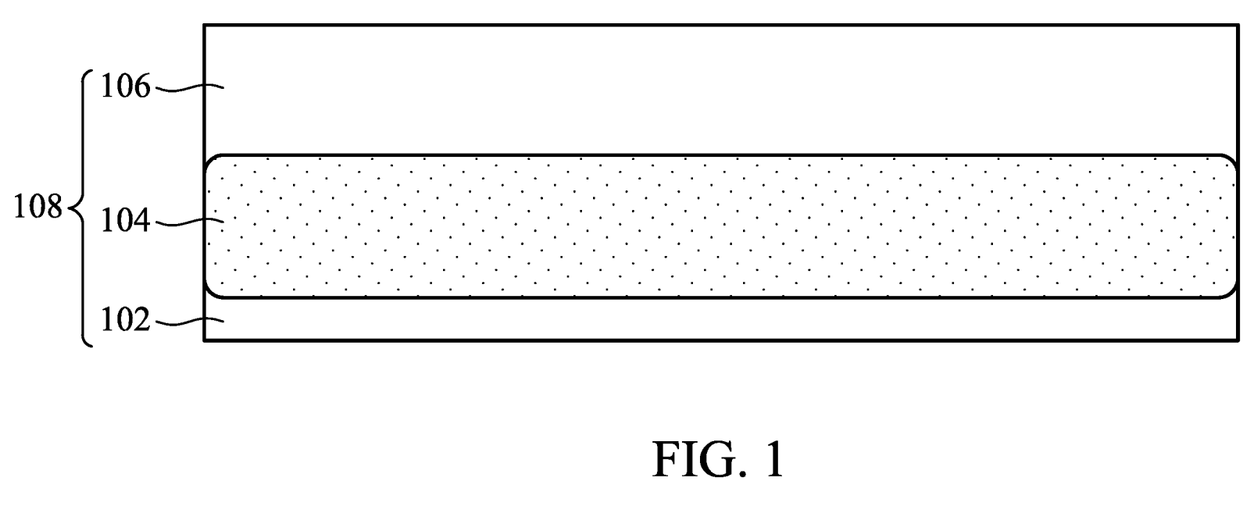
FIGS. 1-8 illustrate cross-sectional views of forming a semiconductor device at various intermediate stages in accordance with some embodiments of the present disclosure.

A substrate 108 is provided, as shown in FIG. 1, in accordance with some embodiments. The substrate 108 is a semiconductor-on-insulator (SOI) substrate, in accordance with some embodiments. The substrate 108 includes a semiconductor substrate 102, an insulating layer 104 formed over the semiconductor substrate 102, and a semiconductor layer 106 formed over the insulating layer 104, in accordance with some embodiments. In some embodiments, the SOI substrate is formed by a separation by implantation of oxygen (SIMOX), a wafer bonding process, an epitaxial layer transfer process, another suitable method; or a combination thereof.

In some embodiments, the semiconductor substrate 102 is a Si substrate. In some embodiments, the semiconductor substrate 102 includes other elementary semiconductors such as Ge; compound semiconductors such as GaN, SiC, GaAs, GaP, InP, InAs, and/or InSb; alloy semiconductors such as SiGe, GaAsP, AlInAs, AlGaAs, GaInAs, GaInP, and/or GaInAsP, or a combination thereof.

The semiconductor substrate 102 is doped, in accordance with some embodiments. For example, the semiconductor substrate 102 may be a phosphorous-doped or an arsenic-doped substrate. For example, the semiconductor substrate 102 may be a boron-doped substrate. The semiconductor layer 106 has a first conductivity type, such as p-type, and the semiconductor substrate 102 has a second conductivity type, such as n-type, in which the second conductivity type is the opposite of the first conductivity type, in accordance with some embodiments. The insulating layer 104 is a buried oxide layer (BOX), in accordance with some embodiments.

In some embodiments, the semiconductor layer 106 has a thickness in a range from about 1 μm to about 15 μm. In some embodiments, the insulating layer 104 has a thickness in a range from about 0.3 μm to about 5 μm.

Figure 2:
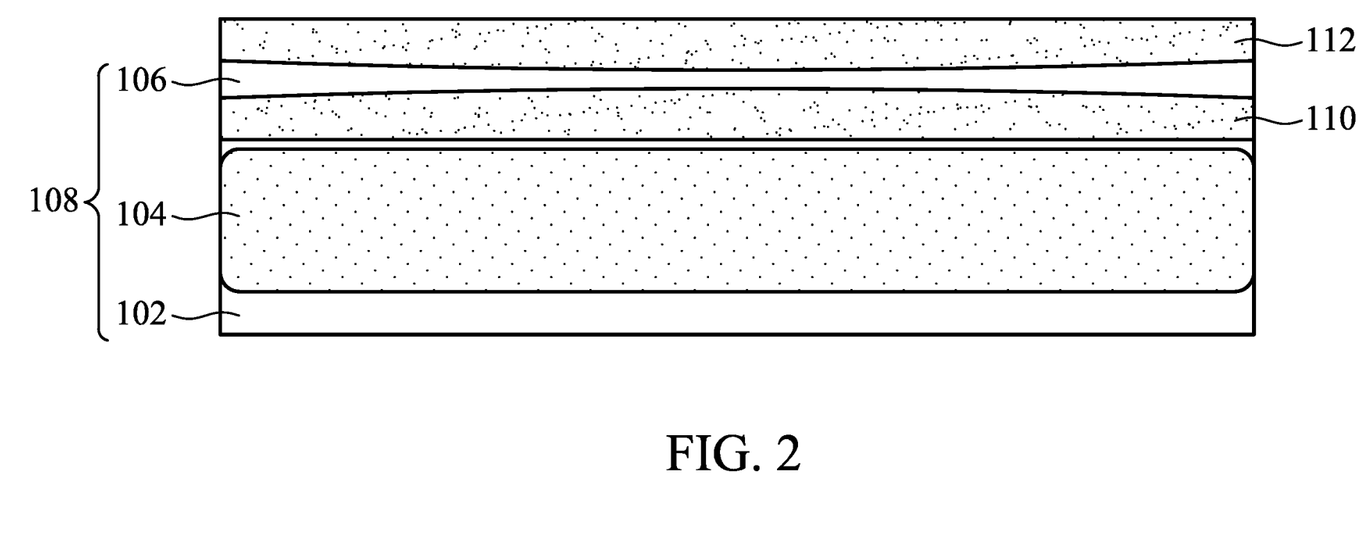

A first buried layer 110 is formed in the semiconductor layer 106 and adjacent to the bottom surface of the semiconductor layer 106, as shown in FIG. 2, in accordance with some embodiments. The first buried layer 110 has the first conductivity type, such as p-type, in accordance with some embodiments. In some embodiments, p-type dopant includes B, Ga, Al, or In ions, or a combination thereof.

A second buried layer 112 is formed over the first buried layer 110 in the semiconductor layer 106 and adjacent to the upper surface of the semiconductor layer 106, as shown in FIG. 2, in accordance with some embodiments. The second buried layer 112 has the second conductivity type, such as n-type, in accordance with some embodiments. In some embodiments, n-type dopant includes P, As, N, or Sb ions, or a combination thereof. The dopant concentration of the first buried layer 110 and the second buried layer 112 may be of any range which may be optimized to eliminate the backside bias effect. If the dopant concentration is too high, the breakdown voltage may worsen.

Figure 3:
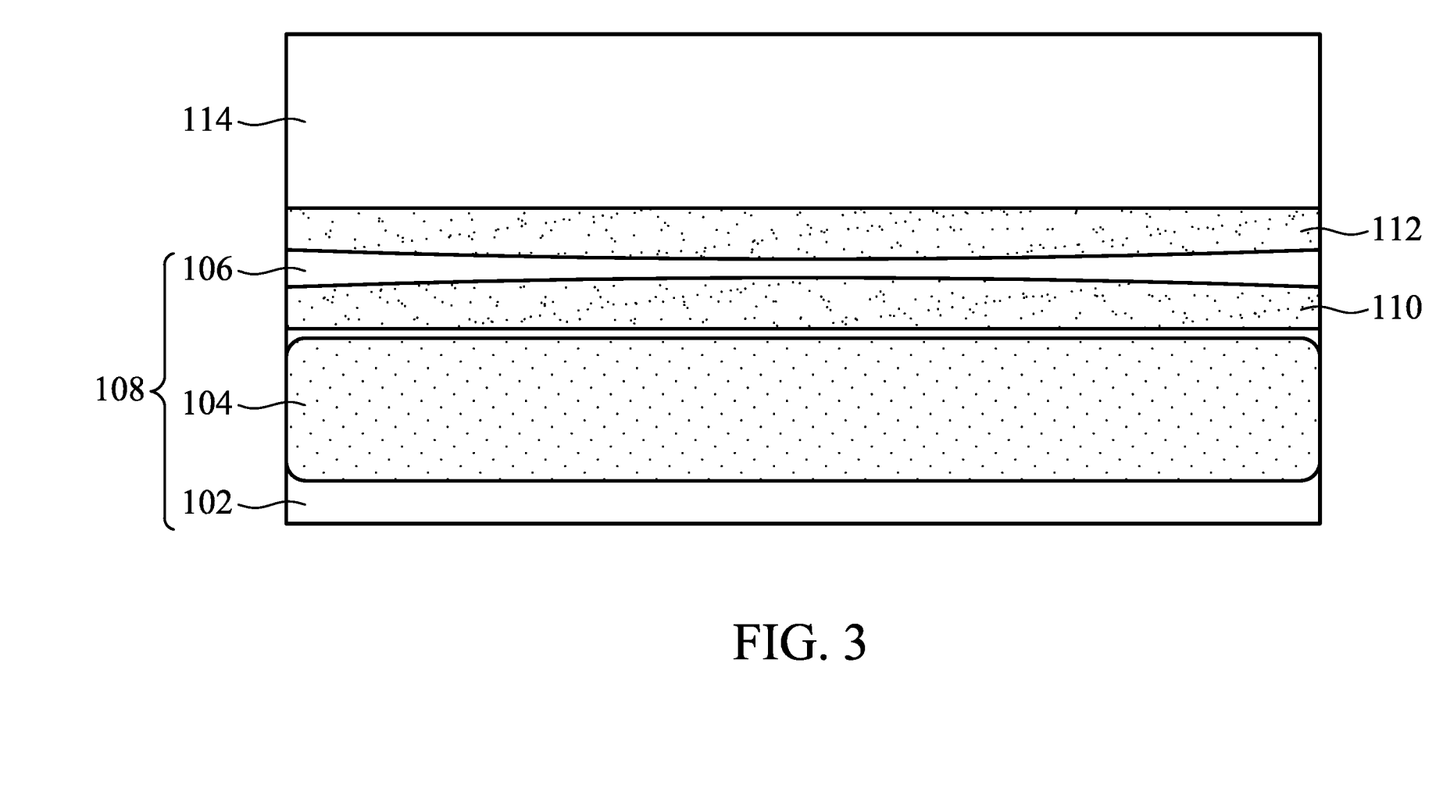

An epitaxial layer 114 is formed over the upper surface of the semiconductor layer 106, as shown in FIG. 3, in accordance with some embodiments. In some embodiments, the epitaxial layer 114 is made of silicon. The epitaxial layer 114 has the first conductivity type, such as P-type, in accordance with some embodiments. In some embodiments, the epitaxial layer 114 has a thickness in a range from about 2 μm to about 15 μm.

In some embodiments, the epitaxial layer 114 is formed using an epitaxial growth process, such as molecular-beam epitaxy (MBE), metal organic chemical vapor deposition (MOCVD), hydride vapor phase epitaxy (HVPE), or a combination thereof. In some embodiments, the epitaxial layer 114 is in-situ doped during the epitaxial growth process.

Figure 4:
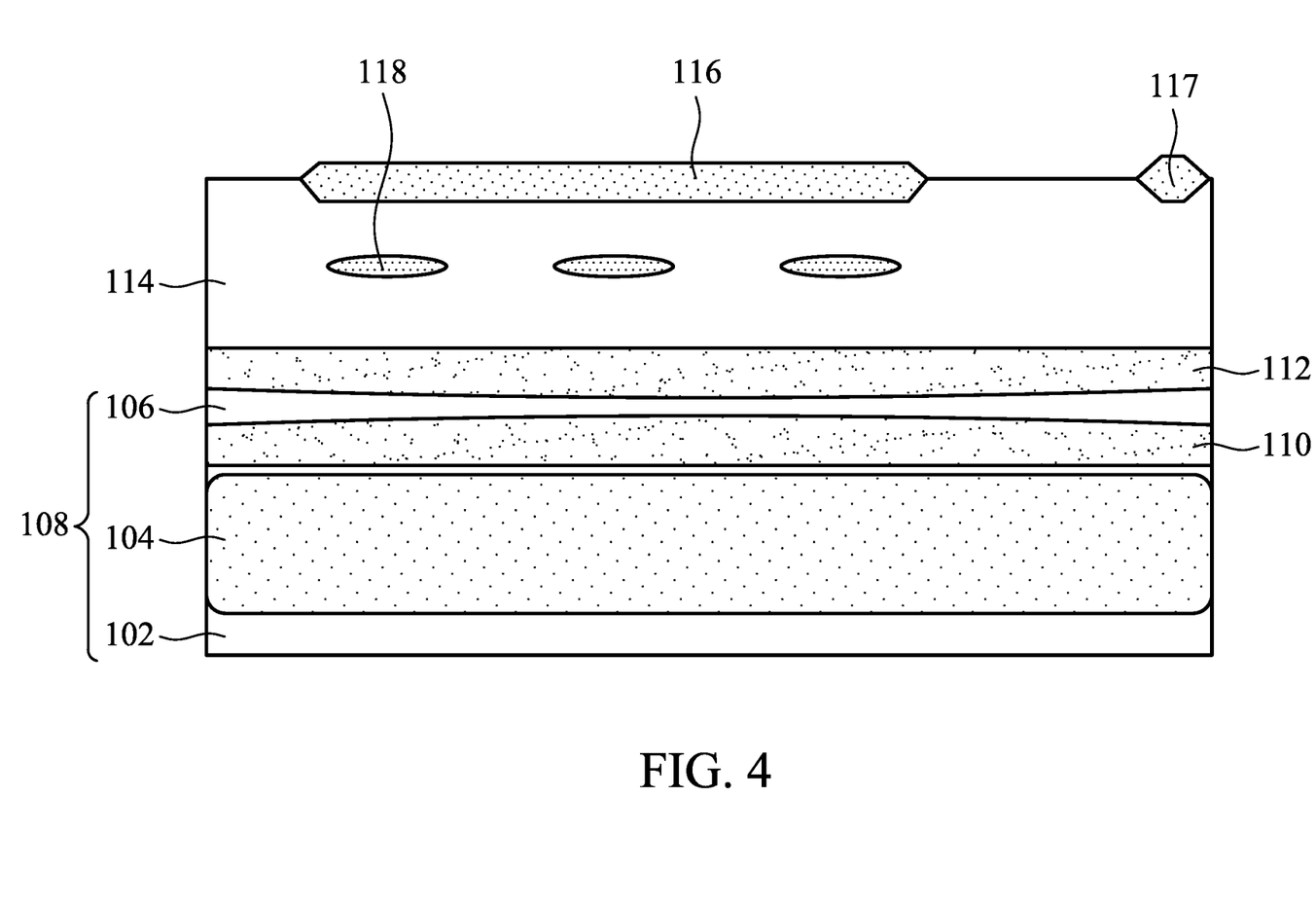

Isolation features 116 and 117 are formed on the upper surface of the epitaxial layer 114, as shown in FIG. 4, in accordance with some embodiments. The isolation features 116 and 117 are separate from each other and have portions embedded in the epitaxial layer 114 to define active regions of a semiconductor device, in accordance with some embodiments. The isolation features 116 and 117 have portions above the upper surface of the epitaxial layer 114, in accordance with some embodiments.

In some embodiments, the isolation features 116 and 117 are field oxide (FOX), local oxidation of silicon (LOCOS), and/or shallow trench isolation (STI) structure. In some embodiments, the isolation features 116 and 117 are made of silicon oxide, silicon nitride, silicon oxynitride, another suitable dielectric material, or a combination thereof. In some embodiments, the isolation features 116 and 117 are formed by a thermal oxidation process. In some embodiments, the formation the isolation features 116 and 117 includes forming trenches by a patterning process (including photolithography and etching processes), depositing an insulating material over the epitaxial layer 114 by a deposition process (such as CVD) to fill the trenches.

One or more doped regions 118 are formed in the epitaxial layer 114, as shown in FIG. 4, in accordance with some embodiments. The number of the doped region 118 may be in a range from one to twenty, such as three, depending on the dimension of the resulting semiconductor device. The doped regions 118 are arranged in a direction parallel to the upper surface of the epitaxial layer 114, in accordance with some embodiments. The doped regions 118 are separated from each other by the epitaxial layer 114, in accordance with some embodiments. In some embodiments, the doped regions 118 are equally spaced, in accordance with some embodiments. In some other embodiments, the doped regions 118 are unequally spaced. In some embodiments, the spacing between two neighboring doped regions 118 is in a range from about 0.05 μm to about 5 μm.

Moreover, the doped regions 118 are located at substantially the same depth that is in a range from about 0.05 μm to about 5 in accordance with some embodiments. In some embodiments, the doped regions 118 are located directly below the isolation features 116. In some embodiments, the doped regions 118 do not laterally extend beyond an end of the isolation features 116.

As used herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

The doped regions 118 have the first conductivity type, such as p-type, in accordance with some embodiments. In some embodiments, the dopant concentration of the doped regions 118 may be greater than, less than, or equal to the dopant concentration of the epitaxial layer 114. The doped regions 118 have the same conductivity type as the epitaxial layer 114, in accordance with some embodiments. In some embodiments, the overall dopant concentration of some regions of the epitaxial layer 114 in which the doped regions 118 are formed is greater than the dopant concentration of some other regions of the epitaxial layer 114 in which the doped regions 118 are not formed.

In some embodiments, the formation of the doped regions 118 includes forming a patterned mask layer (such as a photoresist and/or a hard mask) having one or more openings over the upper surface of the epitaxial layer 114, and performing an ion implantation process through the openings of the patterned mask layer. In some embodiments, the implanting energy of the ion implantation process is in a range from about 1000 keV to about 2500 Kev and the dose of the ion implantation process is in a range from about 5E11 atom/cm$^2$ to about 1E12 atom/cm$^2$. In some embodiments, during the ion implanting process, the dopants pass through the isolation features 116 to form the doped regions 118.

Figure 5:
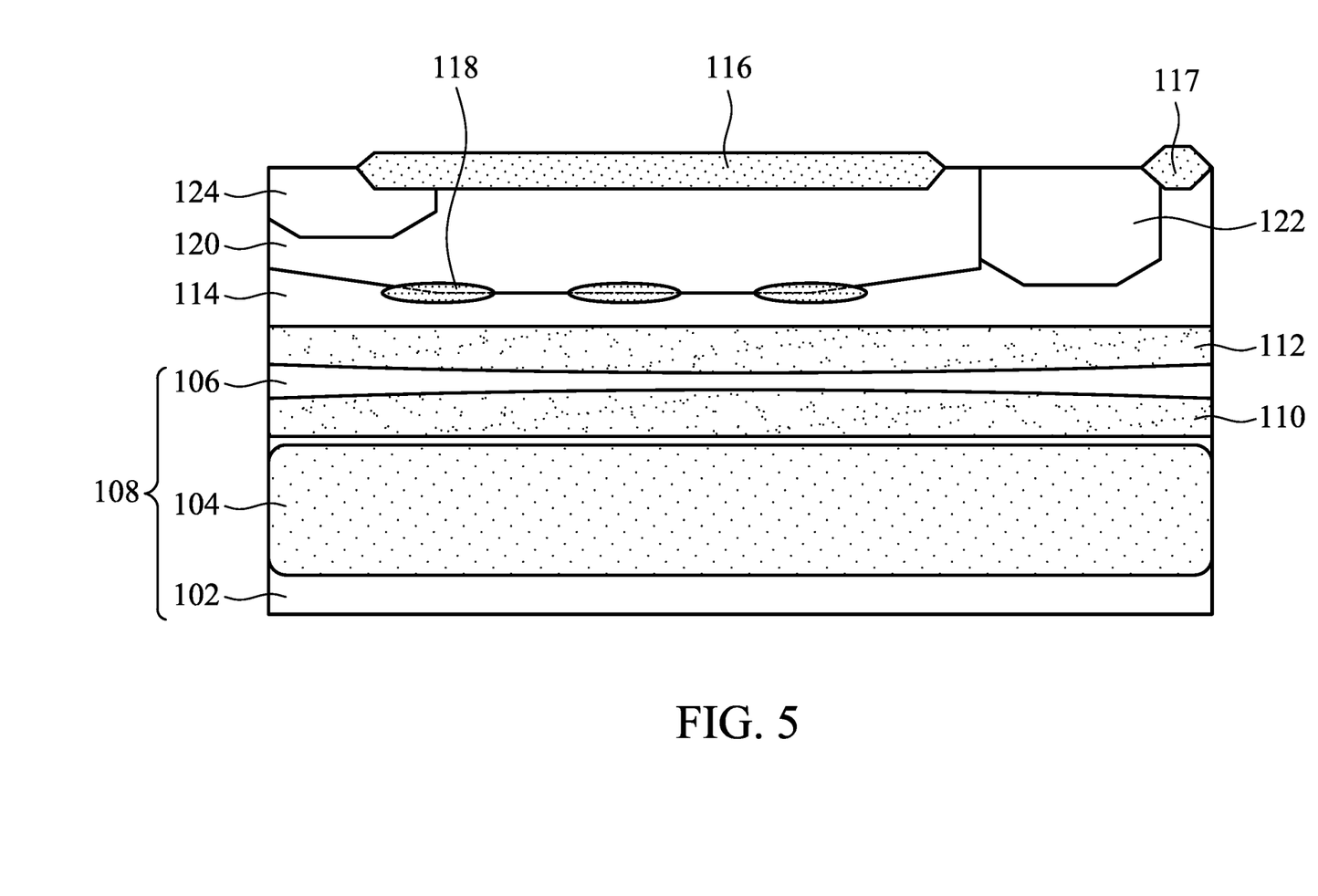

A drift region 120 is formed in the epitaxial layer 114, as shown in FIG. 5, in accordance with some embodiments. The drift region 120 extends downward from the upper surface of the epitaxial layer 114, in accordance with some embodiments. The isolation feature 116 is located on the drift region 120, in accordance with some embodiments. The drift region 120 has the second conductivity type, such as N-type, in accordance with some embodiments. Because the drift region 120 and the epitaxial layer 114 have different conductivity types, a PN junction between the drift region 120 and the epitaxial layer 114 is formed at the bottom surface of the drift region 120.

The doped regions 118 are located adjacent to the bottom surface of the drift region 120, in accordance with some embodiments. In some embodiments, the bottom surface of the drift region 120 laterally passes through the doped regions 118, as shown in FIG. 5, in accordance with some embodiments. The doped region 118 includes an upper portion in the drift region 120 and a lower portion in the epitaxial layer 114 outside the drift region 120, in accordance with some embodiments.

The depth of the drift region 120 is in a range from about 0.05 μm to about 5 μm, in accordance with some embodiments. In some embodiments, the drift region 120 is formed by an ion implantation process.

A first well region 122 is formed in the epitaxial layer 114, as shown in FIG. 5, in accordance with some embodiments. The first well region 122 extends downward from the upper surface of the epitaxial layer 114, in accordance with some embodiments. The first well region 122 and the drift region 120 are in contact with each other, in accordance with some embodiments. In some embodiments, the doped regions 118 do not extend directly below the first well region 122.

The first well region 122 has the first conductivity type, such as P-type, in accordance with some embodiments. In some embodiments, the first well region 122 is formed by an ion implantation process.

A second well region 124 is formed in the drift region 120 in the epitaxial layer 114, as shown in FIG. 5, in accordance with some embodiments. The second well region 124 extends downward from the upper surface of the epitaxial layer 114, in accordance with some embodiments. The second well region 124 is formed at a side of the drift region 120 which is away from the first well region 122, in accordance with some embodiments. The second well region 124 has a portion which extends below the isolation feature 116, in accordance with some embodiments.

The second well region 124 has the second conductivity type, such as N-type, in accordance with some embodiments. In some embodiments, the second well region 124 is formed by an ion implantation process.

A gate structure 126 is formed over the epitaxial layer 114 and partially covers the first well region 122 and the drift region 120, as shown in FIG. 6, in accordance with some embodiments. The gate structure 126 extends on and partially covers the isolation feature 116, in accordance with some embodiments.

In some embodiments, the gate structure 126 includes a gate dielectric layer and a gate electrode layer disposed on the gate dielectric layer (not shown). In some embodiments, the gate dielectric layer is made of, or includes, silicon oxide, silicon nitride, or silicon oxynitride. In some embodiments, the gate dielectric layer is grown by an applicable oxidation process (such as a dry oxidation process or a wet oxidation process), a deposition process (such as CVD), another suitable method, or a combination thereof. In some embodiments, the gate dielectric layer is thermally grown by a thermal oxidation process in oxygen-containing ambient ($O_2$, $H_2O$, NO or $N_2O$).

In some embodiments, the gate dielectric layer is made of, or includes, a high-k dielectric layer (e.g., the dielectric constant is greater than 3.9) such as hafnium oxide ($HfO_2$). In some embodiments, the high-k dielectric layer includes LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfSiO, LaSiO, AlSiO, $BaTiO_3$, $SrTiO_3$, $Al_2O_3$, another suitable high-k dielectric material, or a combination thereof. In some embodiments, the high-k dielectric layer is formed by a thermal oxidation process, a deposition process (e.g., CVD, atomic layer deposition (ALD), or physical vapor deposition (PVD)), another suitable method, or a combination thereof.

In some embodiments, the gate electrode layer is formed on the gate dielectric layer. In some embodiments, the gate electrode layer is made of, or includes, a conductive material, such as polysilicon or metal (e.g., tungsten, titanium, aluminum, copper, molybdenum, nickel, platinum, the like, or a combination thereof). In some embodiments, the gate electrode layer is formed by forming an electrode material using CVD, PVD, electroplating, ALD, another suitable method, or a combination thereof. The electrode material is then patterned by a photolithography process and an etching process to form the gate electrode.

An emitter region 128 and a bulk region 130 are formed in the epitaxial layer 114 outside the drift region 120, as shown in FIG. 7, in accordance with some embodiments. The emitter region 128 and the bulk region 130 are formed in the first well region 122, in accordance with some embodiments. The emitter region 128 and the bulk region 130 each extend downward from the upper surface of the epitaxial layer 114, in accordance with some embodiments. The emitter region 128 is in contact with the bulk region 130, in accordance with some embodiments. The emitter region 128 is formed between the drift region 120 and the bulk region 130, in accordance with some embodiments.

The emitter region 128 has the second conductivity type, such as N-type, in accordance with some embodiments. The bulk region 130 has the first conductivity type, such as P-type, in accordance with some embodiments. In some embodiments, the emitter region 128 and the bulk region 130 are formed by individual ion implantation processes.

A collector region 132 is formed in the second well region 124 in the drift region 120, in accordance with some embodiments. The collector region 132 extends downward from the upper surface of the epitaxial layer 114, in accordance with some embodiments. The collector region 132 has the first conductivity type, such as P-type, in accordance with some embodiments. In some embodiments, the collector region 132 is formed by an ion implantation process.

An interlayer dielectric (ILD) layer 134 is formed over the upper surface of the epitaxial layer 114, as shown in FIG. 8, in accordance with some embodiments. The ILD layer 134 covers the gate structure 126 and the isolation features 116 and 117, in accordance with some embodiments.

In some embodiments, the ILD layer 134 is made of, or includes, one or more single or multiple layers of dielectric materials, such as silicon oxide, silicon nitride, silicon oxynitride, tetraethoxysilane (TEOS), phosphosilicate glass (PSG), borophosphosilicate glass (BPSG), low-k dielectric material, and/or another applicable dielectric material. In some embodiments, the low-k dielectric materials include fluorinated silica glass (FSG), hydrogen silsesquioxane (HSQ), carbon doped silicon oxide, amorphous fluorinated carbon, parylene, bis-benzocyclobutenes (BCB), or polyimide. In some embodiments, the ILD layer 134 may be formed by CVD (e.g., a high-density plasma CVD (HDPCVD), atmospheric pressure CVD (APCVD), low-pressure CVD (LPCVD), or plasma enhanced CVD (PECVD)), a spin-on coating process, another suitable method, or a combination thereof.

An interconnect structure is formed over the upper surface of the epitaxial layer 114, as shown in FIG. 8, in accordance with some embodiments. The interconnect structure includes contact plugs 136a, 136b and 136c penetrating through the ILD layer 134 and respectively landing on the emitter region 128, the bulk region 130 and the collector region 132, in accordance with some embodiments. The interconnect structure also includes an emitter electrode 138 and a collector electrode 140, in accordance with some embodiments. The emitter electrode 138 is in electrical connection with the emitter region 128 and the bulk region 130 through the contact plugs 136a and 136b respectively, in accordance with some embodiments. The collector electrode 140 is in electrical connection with the collector region 132 through the contact plug 136c, in accordance with some embodiments.

In some embodiments, the formation of the interconnect structure includes forming contact openings (not shown) in the ILD layer 134 using a photolithography process (including, for example photoresist coating, soft baking, exposure, post-exposure baking, development, and so on), an etching process (such as a wet etching process, a dry etching process, or a combination thereof), another suitable method, or a combination thereof.

In some embodiments, a conductive material is filled in the openings to form the contact plugs 136a, 136b and 136c. In some embodiments, the conductive material of the contact plugs 136a, 136b and 136c includes metal materials (such as W, Al, or Cu), metal alloys, polysilicon, another suitable conductive material, or a combination thereof.

In some embodiments, the contact plugs 136a, 136b and 136c are formed by PVD (e.g., evaporation or sputtering), an electroplating process, ALD, another suitable process, or a combination thereof to deposit the conductive materials. Afterward, a chemical mechanical polishing (CMP) process or an etching back process is performed to remove excess conductive materials to form the contact plugs 136a, 136b and 136c.

In some embodiments, a barrier layer (not shown) is formed on the sidewalls and the bottoms of the openings before filling the conductive material of the contact plugs 136a, 136b and 136c to prevent the conductive material of the contact plugs 136a, 136b and 136c from diffusing into the ILD layer 134. The barrier layer may also serve as an adhesive or glue layer. The material of the barrier layer may be TiN, Ti, Ta, TaN, W, WN, another suitable material, or a combination thereof. The barrier layer may be formed by depositing the barrier layer materials by PVD (e.g., evaporation or sputtering), ALD, an electroplating process, another applicable process, or a combination thereof.

In some embodiments, the emitter electrode 138 and the collector electrode 140 are formed over the ILD layer 134. In some embodiments, the emitter electrode 138 and the collector electrode 140 is made of, or include, Cu, W, Ag, Sn, Ni, Co, Cr, Ti, Pb, Au, Bi, Sb, Zn, Zr, Mg, In, Te, Ga, another suitable metallic material, an alloy thereof, or a combination thereof. In some embodiments, the emitter electrode 138 and the collector electrode 140 include a stacked structure of TiN/AlCu/TiN.

In some embodiments, a blanket metal layer (not shown) is formed on the ILD layer 134 using PVD (e.g., evaporation or sputtering), an electroplating process, ALD, another suitable method, or a combination thereof. Afterward, the blanket metal layer is patterned by a patterning process to form the emitter electrode 138 and the collector electrode 140. In some embodiments, the patterning process include a photolithography process (including, for example photoresist coating, soft baking, exposure, post-exposure baking, development and so on), an etching process (such as a wet etching process, a dry etching process, another suitable method, or a combination thereof), or a combination thereof.

In some embodiments, the contact plugs 136a, 136b and 136c, the emitter electrode 138, and the collector electrode 140 are formed separately. In some other embodiments, the contact plugs 136a, 136b and 136c, the emitter electrode 138, and the collector electrode 140 are formed simultaneously by a dual damascene process.

After the interconnect structure is formed, a semiconductor device 100 is provided, in accordance with some embodiments. The semiconductor device 100 is a lateral insulated gate bipolar transistor (IGBT) device, in accordance with some embodiments.

In the embodiments of the present disclosure, the semiconductor device 100 includes the substrate 108, the epitaxial layer 114 having the first conductivity type, the drift region 120 having the second conductivity type, and the emitter region 128, the collector region 132. The second conductivity type is the opposite of the first conductivity type. The epitaxial layer 114 is disposed over the substrate 108. The drift region 120 is disposed in the epitaxial layer 114. The emitter region 128 is disposed in the epitaxial layer 114 outside the drift region 120. The collector region 132 is disposed in the drift region 120.

In the embodiments of the present disclosure, the semiconductor device 100 also includes the doped region 118 having the first conductivity type. The doped region 118 is disposed adjacent to the bottom surface of the drift region.

The disclosed embodiments provide at least the following advantages over the conventional IGBT device. The doped region 118, formed adjacent to a PN junction between the epitaxial layer 114 and the drift region 120, has the same conductivity type as the epitaxial layer 114 but the opposite conductivity type of the drift region 120. The doped region 118 can provide additional the dopants of the first conductivity type near the PN junction, thereby forming a larger area of depletion region with the drift region 120, compared to a case without the formation of the drift region 120. Moreover, the doped region 118 is helpful in redistributing the profile of the electric field from the emitter region 128 to the collector region 132, thereby reducing the electric field peak proximate to the emitter region 128 and increasing the potential energy between the emitter region 128 and the collector region 132 (the integrated area of the electric field to the distance). Therefore, the off-state breakdown voltage and the reliability of the semiconductor device can be enhanced.

In addition, for a semiconductor device with larger dimensions, forming a plurality of doped regions 118 that are separate from each other can provide additional dopants of the first conductivity type near the PN junction with precision, compared to forming a single long doped region 118. Therefore, the off-state breakdown voltage and the reliability of the semiconductor device can be enhanced further.

Figure 9:
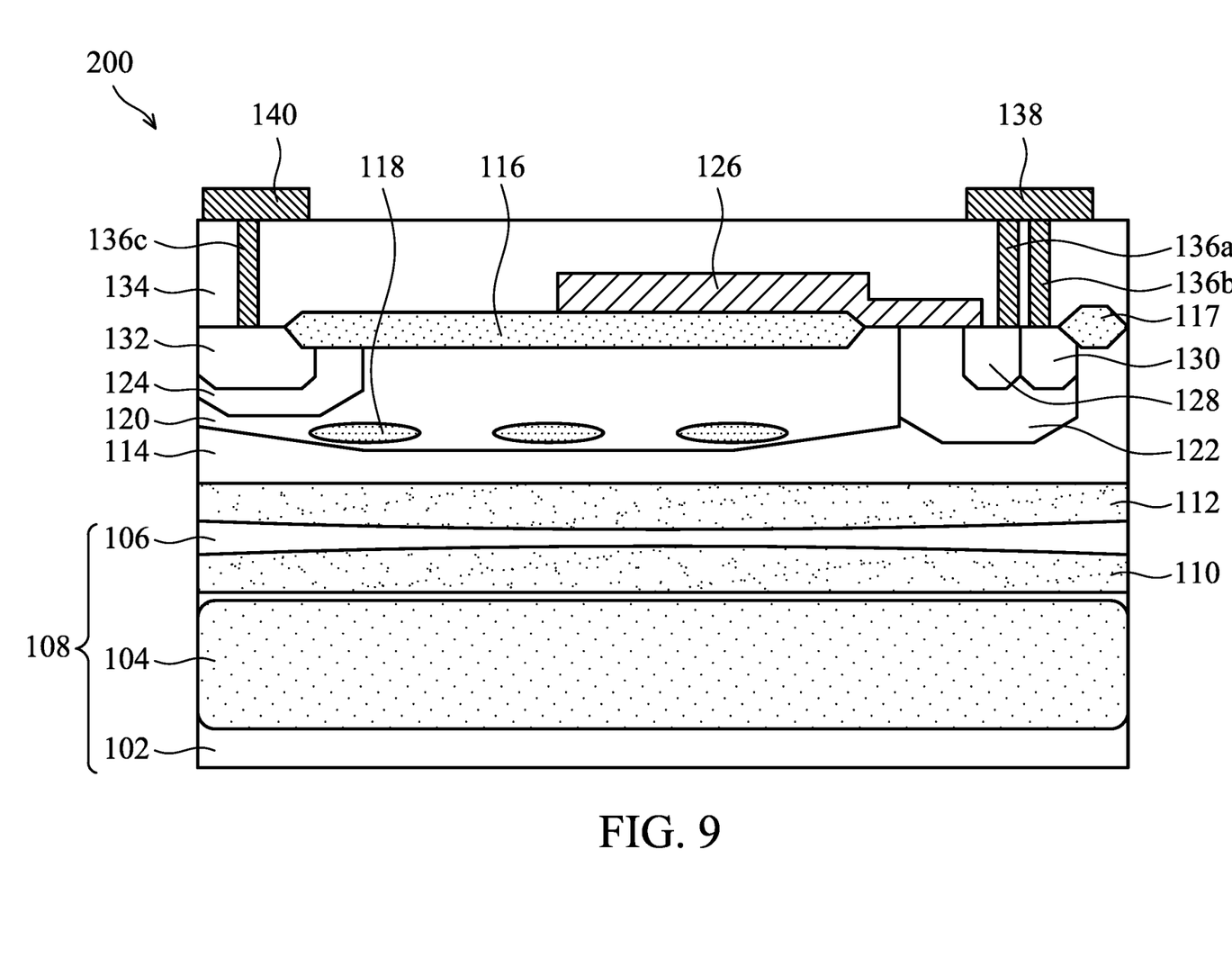
FIG. 9 illustrates a cross-sectional view of a semiconductor device at various intermediate stages in accordance with some embodiments of the present disclosure.
Figure 10:
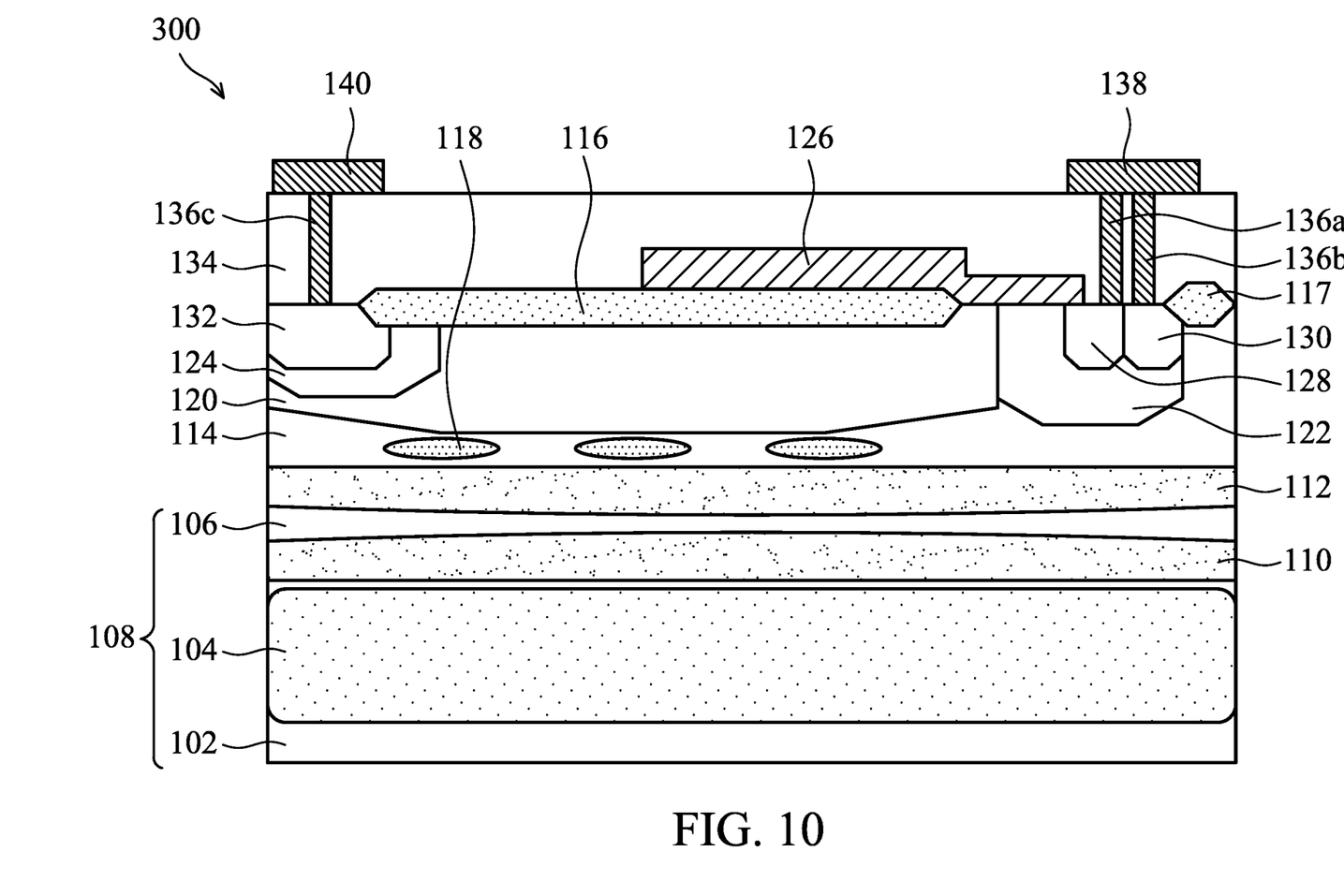
FIG. 10 illustrates a cross-sectional view of a semiconductor device at various intermediate stages in accordance with some embodiments of the present disclosure.

FIGS. 9 and 10 illustrate cross-sectional views of semiconductor devices 200 and 300 at various intermediate stages in accordance with some embodiments of the present disclosure. Elements or layers in FIG. 9 that are the same or similar to those in FIG. 8 are denoted by like reference numerals that have the same meaning, and the description thereof will not be repeated for the sake of brevity.

The difference between the embodiments shown in FIG. 9 and FIG. 8 is that the doped regions 118 in FIG. 9 are entirely formed in the drift region 120. The doped regions 118 are separated from each other by the drift region 120, in accordance with some embodiments. The doped regions 118 are located closer to the bottom surface of the drift region 120 than the upper surface of the drift region 120, in accordance with some embodiments. In some embodiments, the doped regions 118 are located at a level below the second well region 124.

The difference between the embodiments shown in FIG. 10 and FIG. 8 is that the doped regions 118 in FIG. 10 are entirely formed in the epitaxial layer 114 below the drift region 120. The doped regions 118 are separated from each other by the epitaxial layer 114, in accordance with some embodiments. The doped region 118 is located closer to the bottom surface of the drift region 120 than the bottom surface of the epitaxial layer 114, in accordance with some embodiments.

In summary, the semiconductor device includes a doped region formed adjacent to the PN junction between the epitaxial layer and the drift region. The doped region has the same conductivity type as the epitaxial layer but the opposite conductivity type of the drift region. The doped region is helpful in redistributing the profile of the electric field from the emitter region to the collector region. Therefore, the off-state breakdown voltage and the reliability of the semiconductor device can be enhanced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate comprising:
a semiconductor substrate;
an insulating layer disposed over the semiconductor substrate; and
a semiconductor layer disposed over the insulating layer, having a first conductivity type, wherein the epitaxial layer is disposed over the semiconductor layer;
a first buried layer disposed in the semiconductor layer, having the first conductivity type;
a second buried layer disposed over the first buried layer in the semiconductor layer, having a second conductivity type;
an epitaxial layer disposed over the substrate, having the first conductivity type;
a drift region disposed in the epitaxial layer, having the second conductivity type that is the opposite of the first conductivity type;
an emitter region disposed in the epitaxial layer outside the drift region;
a collector region disposed in the drift region; and
a doped region disposed adjacent to a bottom surface of the drift region, having the first conductivity type, wherein the doped region includes a portion in the drift region and a portion outside the drift region and the bottom surface of the drift region laterally passes through the doped region, and wherein a bottom surface of the doped region is spaced apart from the second buried layer with a portion of the epitaxial layer disposed therebetween.

2. The semiconductor device as claimed in claim 1, wherein the portion of the doped region in the drift region is closer to the bottom surface of the drift region than an upper surface of the drift region.

3. The semiconductor device as claimed in claim 1, wherein the portion of the doped region outside the drift region is disposed in the epitaxial layer below the drift region.

4. The semiconductor device as claimed in claim 1, wherein the emitter region has the second conductivity type and the collector region has the first conductivity type.

5. The semiconductor device as claimed in claim 1, further comprising:
a gate structure disposed over the epitaxial layer, wherein the gate structure partially covers the drift region.

6. The semiconductor device as claimed in claim 5, further comprising:
a well region disposed in the epitaxial layer and adjacent to the drift region, having the first conductivity type, wherein the emitter region is disposed in the well region; and
a bulk region disposed in the well region and adjacent to the emitter region, having the first conductivity type, wherein the gate structure partially covers the well region.

7. The semiconductor device as claimed in claim 5, further comprising:
an isolation feature disposed on the drift region, wherein the gate structure partially covers the isolation feature.

8. The semiconductor device as claimed in claim 1, further comprising:
a well region disposed in the drift region, having the second conductivity type, wherein the collector region is disposed in the well region.

9. The semiconductor device as claimed in claim 1, wherein the first conductivity type is p-type and the second conductivity type is n-type.

10. A semiconductor device, comprising:
a substrate comprising:
a semiconductor substrate;
an insulating layer disposed over the semiconductor substrate; and
a semiconductor layer disposed over the insulating layer, having a first conductivity type, wherein the epitaxial layer is disposed over the semiconductor layer;
a first buried layer disposed in the semiconductor layer, having the first conductivity type;
a second buried layer disposed over the first buried layer in the semiconductor layer, having a second conductivity type;

an epitaxial layer disposed over the substrate, having the first conductivity type;
a drift region disposed in the epitaxial layer, having the second conductivity type that is the opposite of the first conductivity type;
a first doped region disposed in the epitaxial layer outside the drift region, having the second conductivity type;
a second doped region disposed in the drift region, having the first conductivity type; and
a plurality of third doped regions disposed adjacent to a junction between the drift region and the epitaxial layer, having the first conductivity type, wherein the plurality of third doped regions include a portion in the drift region and a portion outside the drift region and a bottom surface of the drift region laterally passes through the plurality of third doped regions, and wherein a bottom surface of the plurality of third doped regions is spaced apart from the second buried layer with a portion of the epitaxial layer disposed therebetween.

11. The semiconductor device as claimed in claim 10, wherein the plurality of third doped regions are separated from each other.

12. The semiconductor device as claimed in claim 10, wherein the plurality of third doped regions are located at a same depth.

13. The semiconductor device as claimed in claim 10, wherein the plurality of third doped regions have a same dopant concentration.

14. The semiconductor device as claimed in claim 10, further comprising:
an isolation feature disposed on the drift region, wherein the plurality of third doped regions are disposed directly below the isolation feature; and
a gate structure partially covering the isolation feature.

15. The semiconductor device as claimed in claim 10, wherein the semiconductor device is an IGBT.

16. A method for fabricating a semiconductor device, comprising:
providing a substrate, wherein the substrate comprises:
a semiconductor substrate;
an insulating layer disposed over the semiconductor substrate; and
a semiconductor layer disposed over the insulating layer, having a first conductivity type, wherein the epitaxial layer is disposed over the semiconductor layer;
forming a first buried layer in the semiconductor layer, wherein the first buried layer has a first conductivity type;
forming a second buried layer over the first buried layer in the semiconductor layer, wherein the second buried layer has a second conductivity type;
forming an epitaxial layer over the substrate, wherein the epitaxial layer has the first conductivity type;
forming a doped region in the epitaxial layer, wherein the doped region has the first conductivity type;
forming a drift region in the epitaxial layer, wherein the drift region has the second conductivity type that is the opposite of the first conductivity type, wherein the doped region is located adjacent to a bottom surface of the drift region;
forming an emitter region in the epitaxial layer outside the drift region; and
forming a collector region in the drift region, wherein the doped region includes a portion in the drift region and a portion outside the drift region and the bottom surface of the drift region laterally passes through the doped region, and wherein a bottom surface of the doped region is spaced apart from the second buried layer with a portion of the epitaxial layer disposed therebetween.

17. The method as claimed in claim 16, wherein forming the doped region includes an ion implantation process using an implanting energy in a range from 1000 keV to 2500 keV and a dose in a range from 5E11 atom/cm$^2$ to 1E12 atom/cm$^2$.

* * * * *